United States Patent

Fujimaki

(10) Patent No.: US 7,497,698 B2
(45) Date of Patent: Mar. 3, 2009

(54) ELECTRICAL MODULE AND ELECTRICAL UNIT

(75) Inventor: Hirohiko Fujimaki, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 11/497,347

(22) Filed: Aug. 2, 2006

(65) Prior Publication Data

US 2007/0049070 A1    Mar. 1, 2007

(30) Foreign Application Priority Data

Sep. 1, 2005    (JP)    ............................. 2005-253255

(51) Int. Cl.
*H01R 12/00* (2006.01)
(52) U.S. Cl. .................................... 439/76.2
(58) Field of Classification Search ................ 439/76.2, 439/680, 740, 651, 733.1, 357, 352, 354
See application file for complete search history.

(56) References Cited

U.S. PATENT DOCUMENTS 4,579,730 A * 4/1986 Kidron et al. ............... 424/465
5,830,001 A * 11/1998 Kinoshita et al. ........... 439/354
6,203,354 B1 * 3/2001 Kuwahara et al. .......... 439/357
6,746,284 B1 * 6/2004 Spink, Jr. .................... 439/740

FOREIGN PATENT DOCUMENTS

JP    2002-293201    10/2002

\* cited by examiner

*Primary Examiner*—Edwin A. Leon
(74) *Attorney, Agent, or Firm*—Kratz, Quintos & Hanson, LLP

(57) ABSTRACT

An electrical module and electrical unit, by which workability of the connection work can be improved without deteriorating reliability of the connection, are provided. The electrical module includes: a receiving member for receiving electronic components; a plurality of terminals extending outside the receiving member on a condition that the terminals are electrically connected to the electronic components, the terminals being loosely inserted in insertion holes of a connector so that the electrical module is connected to the connector; a positioning means for positioning the terminals with regard to the insertion holes of the connector; and a fixing means for fixing the receiving member at a position positioned by the positioning means.

6 Claims, 3 Drawing Sheets

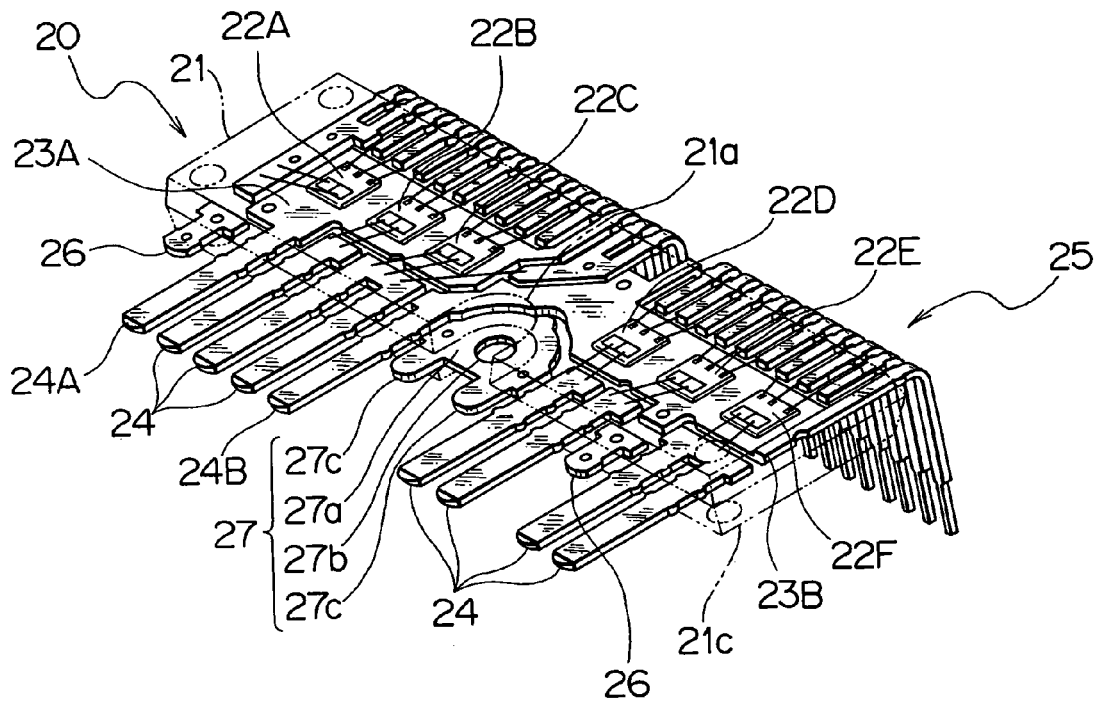
F I G. 3
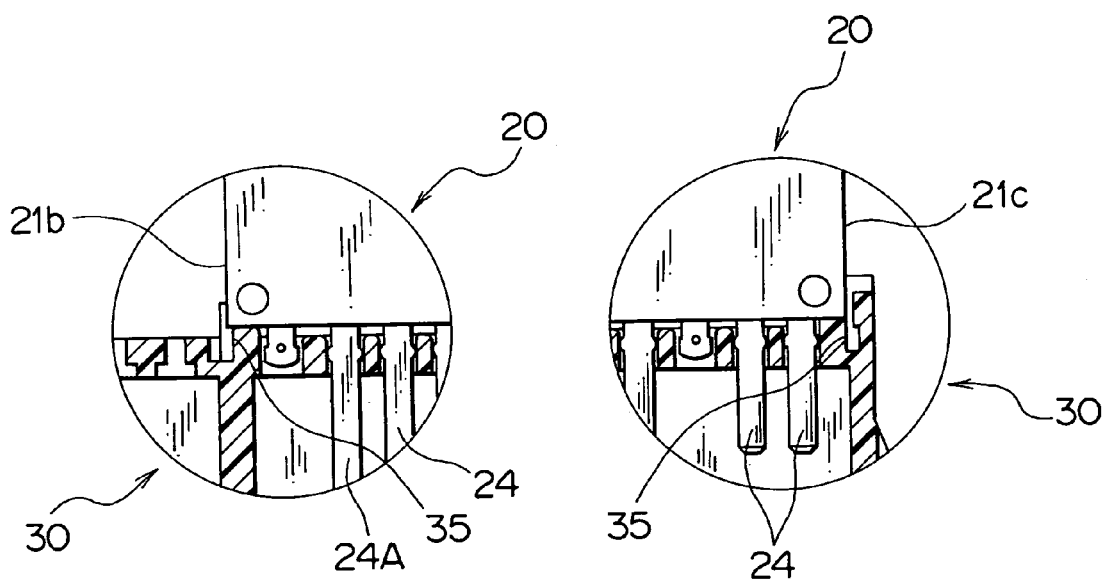
F I G. 6 A    F I G. 6 B

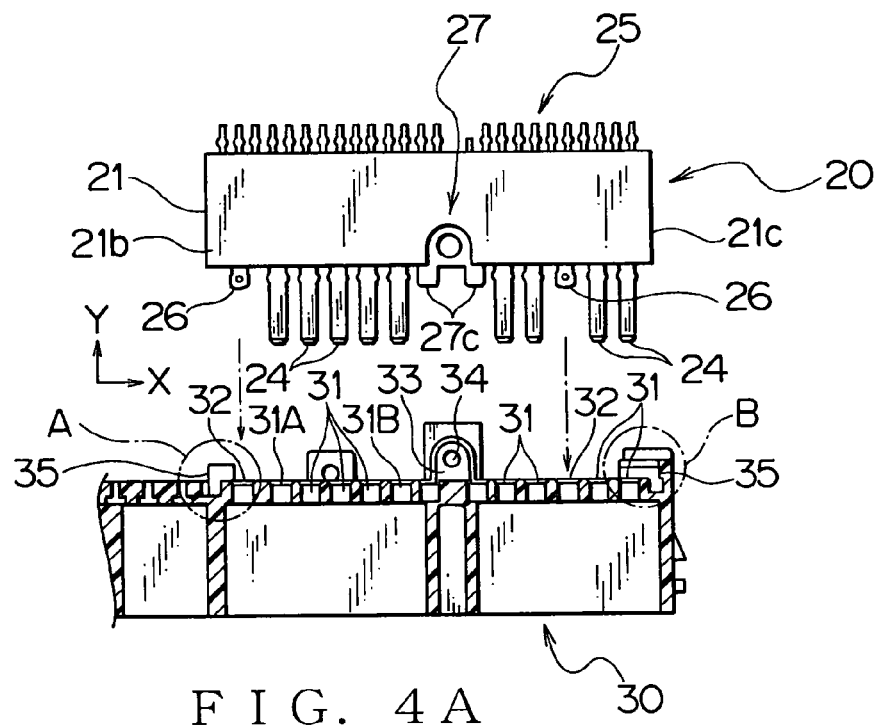
F I G. 4 A
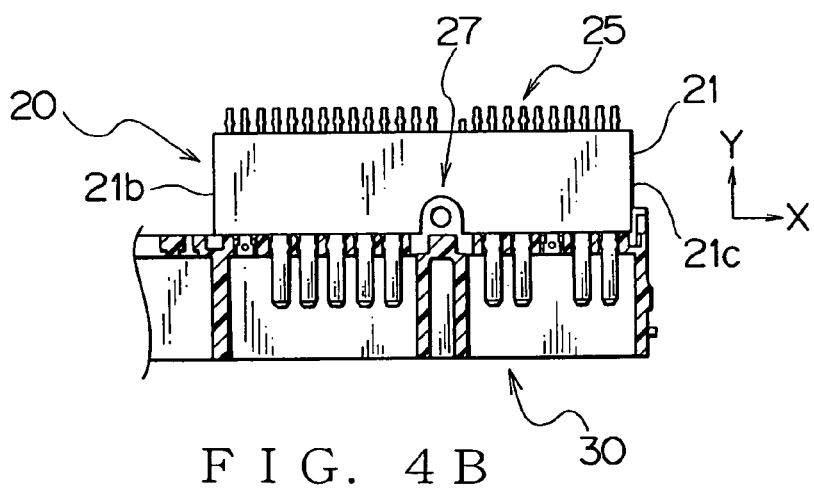
F I G. 4 B
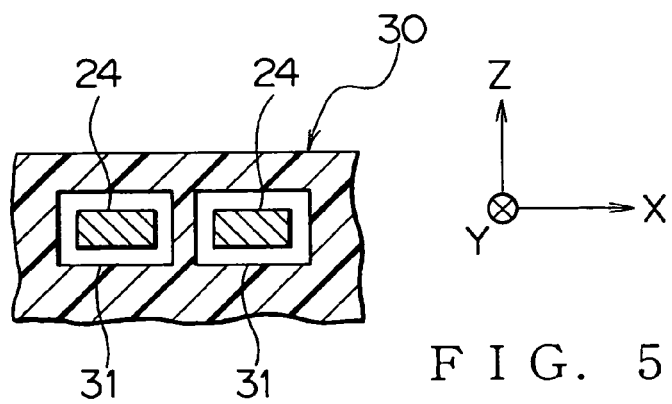
F I G. 5

ELECTRICAL MODULE AND ELECTRICAL UNIT

BACKGROUND OF THE INVENTION (1) Field of the Invention

The present invention relates to an electrical module and electrical unit, and particularly to an electrical module to be connected to a connector by inserting terminals into insertion holes of the connector and to an electrical unit including such an electrical module and a connector.

(2) Description of the Related Art

So far, as an on-vehicle electrical unit in which a semiconductor relay such as an intelligent power switch (IPS) is used, a unit in which a connector for connection and semiconductor relay are mounted on a control board has been known. The connector connects the control board to a load such as a headlamp, fog lamp and various motors. The semiconductor relay supplies electric power to a load according to instructions from the control board.

As such an on-vehicle electrical unit, a unit disclosed in Japanese Patent Application Laid-Open No. 2002-293201 is known. In this on-vehicle electrical unit, a control board and a semiconductor relay module mounted on the control board are received in a case body and the case body is covered with a cover which is a part of a casing. In the semiconductor relay module, a semiconductor relay is glued onto a die pad and further, a lead part to be connected to the control board, connector lead part and electric source lead part are integrally sealed together by a mold. Then, the semiconductor relay module, electronic components for controlling the semiconductor relay module and so on are mounted on the control board.

However, in the on-vehicle electrical unit described above, when the semiconductor relay module is connected to an external load, the lead part for a connector is press-fit into a hole formed in a connector housing so as to protrude it within a receiving space, a screw is screwed into a screwed hole formed in the semiconductor relay module so that the connector and the semiconductor relay module are fixed on the control board, to which a board-connecting lead module of the semiconductor relay module is connected, by screwing. That is, the fixing of the connector and the semiconductor relay module is attained only by a press-fit portion of the connector lead part and therefore, a positioning thereof has been difficult.

Further, since the semiconductor relay module is press-fit into the connector, therefore there might be problems that the connector lead part is bent upon the press-fitting and a chipping with regard to a mold occurs. In an event that automating of the press-fitting work is difficult due to an attaching position of the semiconductor relay module, an operator is forced to do press-fitting work with hands. Therefore, if the press-fitting work requires a large force, the operator is forced to be imposed a heavy burden.

SUMMARY OF THE INVENTION

It is therefore an objective of the present invention to solve the above problems and to provide an electrical module and electrical unit, by which workability of the connection work can be improved without deteriorating reliability of the connection.

In order to attain the above objective, the present invention is to provide an electrical module including:

a receiving member for receiving electronic components;

a plurality of terminals extending outside the receiving member on a condition that the terminals are electrically connected to the electronic components, the terminals being loosely inserted in insertion holes of a connector so that the electrical module is connected to the connector;

a positioning means for positioning the terminals with regard to the insertion holes of the connector; and a fixing means for fixing the receiving member at a position determined by the positioning means.

With the construction described above, each of the terminals extending from the receiving member is positioned by the positioning means and loosely inserted in the insertion hole of the connector and then, the receiving member is fixed to, for example, a housing, connector or board at the determined position by the fixing means, therefore even if the terminals are loosely inserted in the insertion holes of the connector, the connection reliability can be maintained. Here, loose insertion means that an inserted article is inserted having some room.

Preferably, the fixing means is fixed to a fixing member formed in the connector.

With the construction described above, heat can be released from the electrical module to the connector through the fixing means.

Preferably, the positioning means extends outside the receiving member in such a manner that a length of the positioning means is shorter than that of the terminals, and the terminals are fit in the insertion holes of the connector immediately before connection of the electrical module to the connector is completed.

With the construction described above, the electrical module can be stably connected to the connector.

In order to attain the above objective, the present invention is to provide an electrical unit including:

the electrical module as described above; and a connector to which the electrical module is connected, the connector including insertion holes for loosely inserting terminals of the electrical module therein.

With the construction described above, each of the terminals extending from the receiving member is positioned by the positioning means and loosely inserted in the insertion hole of the connector and then, the receiving member is fixed at the determined position by the fixing means, therefore even if the terminals are loosely inserted in the insertion holes of the connector, the connection reliability can be maintained.

Preferably, the connector includes a connector-side positioning means which determines a connection position of the electrical module.

With the construction described above, more precise positioning can be carried out.

BRIEF DESCRIPTION OF THE DRAWINGS

FIG. 3 is a perspective view illustrating an example of construction of the electrical unit shown in FIG. 1;

FIG. 4A is a view illustrating a state when an electrical unit according to the present invention is not yet connected to a connector;

FIG. 4B is a view illustrating a state when an electrical unit according to the present invention is connected to a connector;

FIG. 5 is a partially enlarged view illustrating relation between a terminal and an insertion hole in a X-direction in FIGS. 4A and 4B;

FIG. 6A is an enlarged view of a part A in FIG. 4A; and

FIG. 6B is an enlarged view of a part B in FIG. 4A.

DESCRIPTION OF THE PREFERRED EMBODIMENTS

In the following, the preferred embodiments of an electrical module and electrical unit according to the present invention are explained with reference to FIGS. 1-6B.

Figure 1:
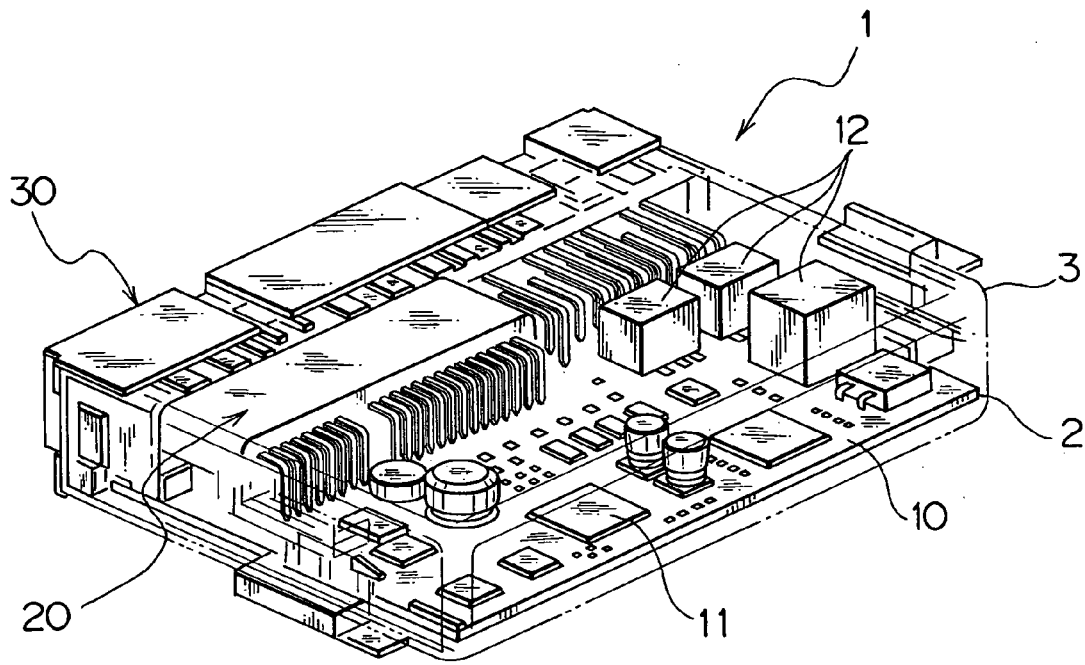
FIG. 1 is a perspective view illustrating an electrical unit according to the present invention.

In FIG. 1, an electrical unit 1, which is to be mounted on a vehicle and so on, includes a control board 10, semiconductor relay module 20 as an electrical module, and connector 30. A case body 2 having a rectangular tray-shape receives the control board 10, semiconductor relay module 20 and connector 30 therein. The case body 2 is covered with a cover 3.

The case body 2 is preferably made of electrically insulating material having a good heat-release characteristic. However, the case body 2 may be made of metal provided that the electrical insulation with regard to the control board 10 is assured. The cover 3 is made of metallic material having high thermal conductivity and good heat-release characteristic such as aluminum. As shown in FIG. 1, the case body 2 and cover 3 receive the connector in one side thereof on a condition that the case body 2 and cover 3 are assembled to each other.

Control members 11 such as a microprocessor unit (MPU), large scale integration (LSI) and so on, and known electronic components 12 are mounted on the control board 10. Further, the control board 10 is provided with wiring patterns (now shown in the figure) which are connected to the control members 11 and the electronic components 12 so as to form a circuit. A plurality of board terminals 37 extending from the connector 30 are connected to one side edge of the control board 10. Electric power supply and various signal transmission are carried out to the control board 10 through the board terminals 37.

Figure 2:
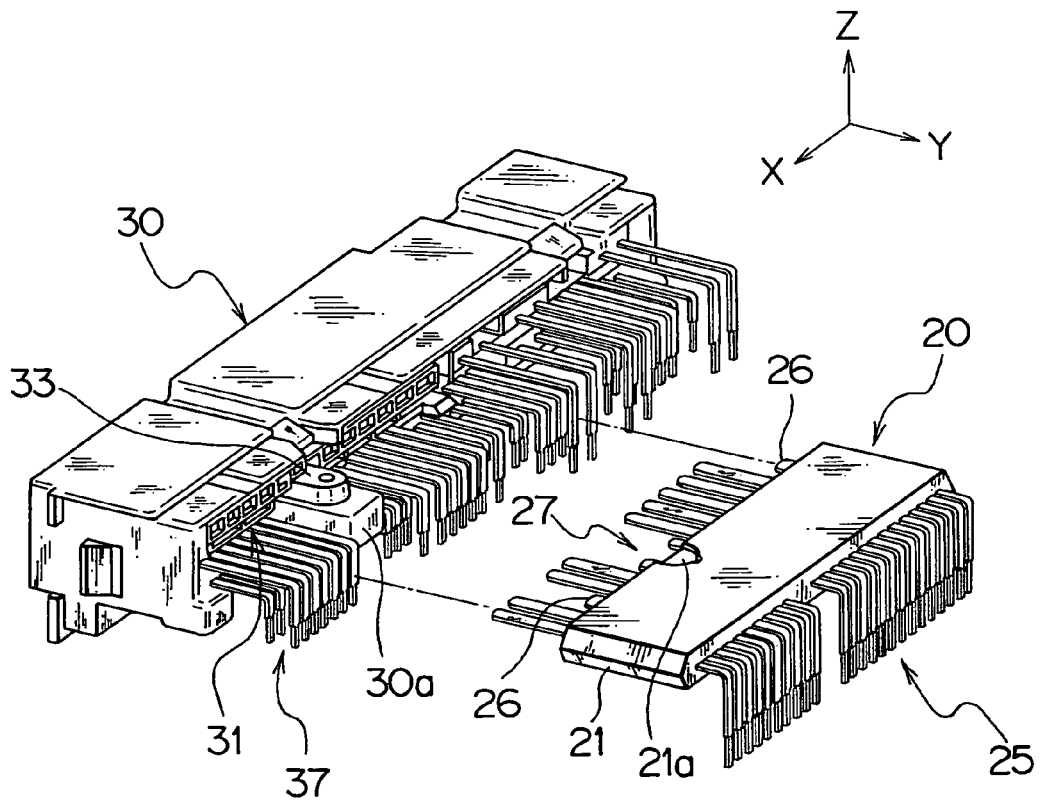
FIG. 2 is a perspective view illustrating an example of relation between an electrical unit and a connector.

As shown in FIGS. 2 and 3, the semiconductor relay module 20 includes: a resin mold part 21 resin-sealed in a rectangular shape, in which a plurality of semiconductor relays 22A, 22B, 22C, 22D, 22E and 22F are mounted on die pads 23A and 23B; a plurality of connector leads 24 extending from one side of the resin mold part 21; power supply leads 24A and 24B connected to the die pads 23A and 23B, the power supply leads 24A and 24B being arranged in parallel with the adjacent connector leads 24; a plurality of board connection lead parts 25 extending from an opposite side of the resin mold part 21; a positioning element 26; and a positioning-fixing element 27.

The resin mold part 21 is the receiving member, in which end portions of the electric source lead parts, connector lead part, positioning element 26 and positioning-fixing element 27 near to the semiconductor relays 22A-22F and the semiconductor relays 22A-22F are sealed with resin in a rectangular shape by molding. That is, the power supply leads 24A and 24B and the connector leads 24 are extended from one side of the resin mold part 21 in the longitudinal direction of the resin mold part 21.

As each of the semiconductor relays 22A-22F, an intelligent power switch, metal oxide silicon field effect transistor (MOSFET) or the like are used and mounted on each surface of the power supply leads 24A and 24B. Drain electrodes as back side electrodes are connected to the die pads 23A and 23B of the power supply leads 24A and 24B, respectively, thereby increasing current capacity to make it relatively higher than those of the surface electrodes of the semiconductor relays, so that large current can flow into the power supply leads 24A and 24B.

Each of the power supply leads 24A and 24B is inserted in an insertion hole 31 of the connector 30 and connected to a terminal connected to an electric wire extended from a power supply on the side of the connector 30, thereby being electrically connected to the power supply through the electric wire.

Each of the connector leads 24 is inserted in the insertion hole 31 of the connector 30 and connected to a terminal connected to an electric wire extended from load such as a motor for driving a headlamp or wiper on the side of the connector 30, thereby being electrically connected to each outside load through the electric wire.

The power supply leads 24A and 24B and the connector leads 24 may be made of a metal plate formed in a predetermined shape by stamping or etching, the metal being, for example, aluminum, copper, copper alloy such as Cu—Fe, Cu—Fe—P, Cu—Cr, Cu—Ni—Si or Cu—Sn, nickel-iron alloy such as Ni—Fe or Fe—Ni—Cu, and a composite of copper and stainless steel. Materials obtained by subjecting the above metallic materials to nickel-plating, silver-plating or gold-plating can be also used.

Each of the power supply leads 24A and 24B and the connector leads 24 has a large width since a large current flows therethrough. The connectors lead 24 supply electric power from the power supply leads 24A and 24B to the loads in response to switching actions of the semiconductor relays 24A-24F, to which the connector leads 24 are connected.

Similarly to the power supply leads 24A and 24B and the connector leads 24, the board connection lead parts 25 are formed in a predetermined shape by stamping or etching metallic members. H/L signals (control signals) outputted from the control members 11 and the electronic components 12 and current-detecting signals (status signals) on the side of the semiconductor relays 24A-24F are transmitted from the board connection lead parts 25.

Source electrodes (not shown in the figure) formed as surface electrodes (bonding pads) of the semiconductor relays 22A-22F are wire-bonded to the connector leads 24 which are connected to the loads that are subjects of the respective switching actions. Gate electrodes (not shown in the figure) formed as the other surface electrodes (bonding pads) of the semiconductor relays 22A-22F are wire-bonded to the board connection lead parts 25.

Bonding wires as conductors, which connect the bonding pads on the side of the semiconductor relays to the connector leads 24 or connect the bonding pads to the board connection lead parts 25, may be aluminum wires, gold wires, copper wires or ribbons thereof.

The positioning element 26 consisting of a pair of positioning terminals is the positioning means. Similarly to the power supply leads 24A and 24B, the connector leads 24, and the board connection lead parts 25, the positioning element 26 is formed in a predetermined shape by stamping or etching metallic members. The positioning element 26 is formed as a pair of the terminals having a plate-shape so that it is shorter than each of the power supply leads 24A and 24B, the connector leads 24, and the board connection lead parts 25 that extend to the outside of the resin mold part 21.

When the terminals 24 are inserted into the insertion holes 31 of the connector 30, the positioning element 26 is engaged with the connector 30 just before completion of the connection, so that the semiconductor relay module 20 is connected to the connector 30 by positioning with the positioning element 26. Therefore, the semiconductor relay module 20 can be connected to the connector 30 on a stable condition, thereby improving the connection reliability. The positioning element 26 may be formed of resin member.

The positioning element 26 is provided with a locking structure such as a recess, hollow or through hole, wherein said locking structure engages with a mating locking structure on the side of the connector 30, so that the positioning element 26 is fixed at a precise position with respect to the connector 30 and that the positioning element 26 prevents the semiconductor relay module 20 from moving to a direction (Y-direction in FIG. 2) in which the semiconductor relay module 20 comes out from the connector 30.

In the preferred embodiment described above (see FIG. 3), the positioning elements 26 are provided at positions near to both sides of the resin mold part 21. However, instead, the number and positions of the positioning elements 26 can be appropriately determined depending upon a size of the semiconductor relay module 20 and a connection relationship between the semiconductor relay module 20 and the connector 30. The positioning elements 26 are engaged with engaging parts on the side of the connector 30 so that the positioning elements 26 are positioned in a lateral direction (X-direction in FIG. 2) and a longitudinal direction (Y-direction in FIG. 2).

Since the terminals 24 are positioned in the lateral and longitudinal directions of the connector 30 when the terminals 24 are inserted into the insertion holes 31 of the connector 30, therefore the terminals 24 can be securely prevented from positionally shifting due to an external force generated in the lateral and longitudinal directions when the connection is being carried out, thereby improving the connection reliability.

As shown in FIGS. 3 and 4, the positioning-fixing element 27 includes a flat plate-shaped base 27a, through hole 27b formed at a center of the base 27a, and a pair of projections 27c extending in the same direction as the direction in which the positioning elements 26 extend.

The base 27a is exposed from a hollow 21a of the resin mold part 21 correspondingly to a shape of a fixing part 33 of the connector 30. The hollow 21a of the resin mold part 21 is formed in a shape corresponding to an external form of the fixing part 33 of the connector 30.

The through hole 27b is provided at a position correspondingly to a screw hole 34 of the fixing part 33 of the connector 30. The through hole 27b has such a size that only a screw-shaped groove part of a screw (not shown in the figure) penetrates therethrough and a head part of the screw does not penetrate therethrough.

The pair of the projections 27c is formed on the base 27a extending from the resin mold part 21 having the same length as that of the positioning element 26. The pair of the projections is inserted into an engaging hole 32 of the connector 30 so as to engage with the engaging hole 32, thereby positioning each lead in the lateral and longitudinal directions of the connector 30.

Similarly to the power supply leads 24A and 24B and the connector leads 24, the positioning-fixing element 27 is formed in a shape corresponding to the base 27a, through hole 27b and the pair of the projections 27c by stamping or etching a metal member. Similarly to the power supply leads 24A and 24B and the connector leads 24, the positioning-fixing element 27 resin-seals an edge of the base 27a with the resin mold part 21.

Thus, the positioning-fixing element 27 is formed, the screw penetrates through the through hole 27b after the projections 27c are inserted into the engaging hole 32 of the connector 30, and the base 27a is fixed to the fixing part 33 of the connector 30 with the screw. Since the positioning-fixing element 27 is positioned in the lateral direction of the connector 30 and then, positioned in the longitudinal direction thereof and then, fixed to the connector 30, therefore the resin mold part 21 that seals the positioning-fixing element 27 can be also fixed to the connector 30. Accordingly, heat of the semiconductor module 20 can be released through the positioning-fixing element 27, thereby providing the semiconductor module 20 having high heat-releasing property.

Since the positioning-fixing element 27 is formed near the connection center between the power supply leads 24A and 24B and the connector leads 24 of the semiconductor module 20 and the connector 30, therefore the semiconductor module 20 can be securely fixed to the connector 30, thereby further improving the connection property.

As shown in FIGS. 4 and 5, the connector 30 includes a plurality of the insertion holes 31, a plurality of power supply insertion holes 31A and 31B, a plurality of the engaging holes 32, fixing part 33, screw hole 34, a pair of engaging parts 35 and the board terminal 37.

The insertion holes 31 are lined up correspondingly to the connector leads 24 of the semiconductor module 20. As shown in FIG. 5, the insertion hole 31 is formed so that its section crossing the insertion direction of the connector lead 24 is larger than a section of the connector lead 24 crossing the insertion direction. Thus, the connector lead 24 is loosely inserted into the insertion hole 31. Therefore, press-fitting work of the semiconductor module 20 into the insertion hole 31 is unnecessary, thereby facilitating the connection work.

The engaging hole 32 is a hole that is about the same as the insertion hole 31, being situated between the insertion holes 31. The insertion hole 31 may be replaced by other structures such as an engaging piece or engaging groove provided that it has capability of the positioning.

The fixing part 33 is formed correspondingly to the positioning-fixing element 27 of the semiconductor module 20 and formed on an upper surface of a connector housing 30a so as to have an arc-shape end portion (see FIG. 2). The screw hole 34 is formed in the proximity of the center of the fixing part 33 and continues to the connector housing 30a. Here, the fixing part 33 and the connector housing 30a can be made of resin member or metal member having high thermal conductivity so as to provide the semiconductor module 20 and electrical unit 1 having high heat-releasing property.

Each of the engaging part 35 is the connector-side positioning means and is formed in the connector 30 as a projection, which is situated at a position corresponding to both sides of the lateral width (X-direction) of the resin mold part 21 of the semiconductor module 20 and extends toward Y-direction from the connector housing 30a. The engaging part 35 guides the resin mold part 21 in the insertion direction (Y-direction) on a condition that side surfaces 21b, 21c are engaged with an inner surface of the engaging part 35. The engaging part 35 positions the semiconductor module 20 with regard to the connector 30.

Thus, the connector 30 is provided with the pair of the engaging parts 35 so that the semiconductor module 20 is positioned by the pair of the engaging parts 35 for the connection, thereby improving the connection reliability.

The connector-side positioning means may be other structures such as a slide structure or fitting structure.

In the following, an example of assembling of the electrical unit 1 will be explained with reference to FIGS. 1-6.

As shown in FIG. 4A, the semiconductor module 20 is moved toward the connector 30 so that the connector leads 24 are inserted into the insertion holes 31 and the power supply leads 24A and 24B are inserted into the insertion holes 31A and 31B, so that each lead is loosely inserted into the corresponding hole. Thereafter, when the semiconductor module 20 is moved further, the positioning element 26 and each of the projections 27c are engaged with the engaging holes 32 of the connector 30 and each of the side surfaces 21b and 21c is engaged with the engaging part 35 of the connector 30, so that the semiconductor module 20 is positioned in the lateral and longitudinal directions of the connector 30.

As shown in FIG. 4B, when the semiconductor module 20 is moved up to the connection position of the connector 30 so that the through hole 27b of the fixing element 27 of the semiconductor module 20 overlaps with the screw hole 34 of the connector 30 so as to form a continuous hole, the screw screws with the continuous hole so that the semiconductor module 20 is fixed to the connector 30. Then, the semiconductor module 20 and the connector 30 are mounted on the control board 10 and then, mounted on the case body 2 and covered with the cover 3, thereby forming the electrical unit 1.

When the semiconductor module 20 in the electrical unit 1 supplies electric power to a load connected through the connector 30, the electric power inputted from the power supply lead 24A and 24B is supplied to a load from the connector lead 24 by means of switching of the semiconductor relays 22A-22F controlled by the control member 11. Therefore, the power supply current does not flow into the control board 11 and heat can be released from an electric wire connected to the connector 30, therefore the heat-releasing property of the semiconductor module 20 can be improved.

Since each of the connector leads 24 and power supply lead 24A and 24B extending from the resin mold part 21 of the semiconductor module 20 is positioned by the positioning element 26 and the projection 27c of the positioning-fixing element 27 so as to be loosely inserted in the insertion hole 31 of the connector 30 and fixed at the positioned position by the positioning-fixing element 27. That is, even if each lead is loosely inserted in the connector 30, the connection reliability can be maintained and each lead can be easily inserted into the insertion hole 31 of the connector 30, so that the connection work can be facilitated without deteriorating the connection reliability and the man-hour can be reduced. That is, the electrical unit 1 having the advantages described above can be attained.

The positioning-fixing element 27 as described above may be divided into the positioning means and the fixing means.

In the preferred embodiments described above, the semiconductor module 20 is fixed to the connector 30. However, instead, the semiconductor module 20 may be fixed to, for example, the control board 10 or the case body 2 of the electrical module 1.

What is claimed is:

1. An electrical module comprising:
   a connector;
   a receiving member for receiving electronic components;
   a plurality of terminals extending outside the receiving member on a condition that the terminals are electrically connected to the electronic components, the terminals being loosely inserted in insertion holes of the connector so as to be electrically connected to respective mating terminals received in the connector, so that the electrical module is electrically connected to the connector;
   a positioning means for positioning the terminals with regard to the insertion holes of the connector; and
   a fixing means, separate from the insertion holes, for fixing the receiving member at a position determined by the positioning means, said fixing means including an element disposed on said receiving member and a fixing part disposed on said connector, for engagement therebetween;
   wherein the electronic components and a plurality of leads are sealed with resin in the receiving member, said leads extending outside from a side of the receiving member so as to be the terminals, and the positioning means and the fixing means are partly sealed with resin in the receiving member.

2. The electrical module according to claim 1 wherein the fixing means is fixed to a fixing member formed in the connector.

3. The electrical module according to claim 1, wherein the positioning means extends outside the receiving member in such a manner that a length of the positioning means, as measured in a direction of inserting the terminals in the insertion holes of the connector, is shorter than that of the terminals, and the terminals are fit in the insertion holes of the connector immediately before electrical connection of the electrical module to the connector is completed.

4. The electrical module according to claim 1, wherein the positioning means is formed integrally with the fixing means.

5. An electrical unit comprising: the electrical module according to claim 1; and a connector to which the electrical module is electrically connected, the connector including insertion holes for loosely inserting terminals of the electrical module therein.

6. The electrical unit according to claim 5, wherein the connector includes a connector-side positioning means which determines a connection position of the electrical module.

* * * * *